(12) United States Patent
Danilov et al.

(10) Patent No.: US 10,929,256 B2
(45) Date of Patent: Feb. 23, 2021

(54) PROACTIVE DISK RECOVERY OF STORAGE MEDIA FOR A DATA STORAGE SYSTEM

(71) Applicant: EMC IP Holding Company LLC, Hopkinton, MA (US)

(72) Inventors: Mikhail Danilov, Saint Petersburg (RU); Konstantin Buinov, Prague (CZ)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 192 days.

(21) Appl. No.: 16/254,766

(22) Filed: Jan. 23, 2019

(65) Prior Publication Data

US 2020/0233765 A1 Jul. 23, 2020

(51) Int. Cl.
  *G06F 11/10* (2006.01)
  *G06F 11/20* (2006.01)
  *H03M 13/15* (2006.01)

(52) U.S. Cl.
  CPC ....... *G06F 11/2094* (2013.01); *H03M 13/154* (2013.01); *G06F 2201/82* (2013.01)

(58) Field of Classification Search
  CPC ............. G06F 11/1088; G06F 11/1092; G06F 11/2094
  USPC ........................................ 714/6.32, 6.2, 6.22
  See application file for complete search history.

(56) References Cited

U.S. PATENT DOCUMENTS

| | | | | |
|---|---|---|---|---|
| 10,176,065 | B2* | 1/2019 | Madsen | G06F 11/3034 |
| 2014/0129874 | A1* | 5/2014 | Zaltsman | G06F 11/108 |
| | | | | 714/6.11 |
| 2015/0286531 | A1* | 10/2015 | Bondurant | G06F 11/1088 |
| | | | | 714/6.23 |
| 2015/0347228 | A1* | 12/2015 | Yang | G06F 11/1068 |
| | | | | 714/704 |
| 2017/0255589 | A1* | 9/2017 | Barber | G06F 16/219 |
| 2019/0042379 | A1* | 2/2019 | Aklik | G06F 11/076 |
| 2019/0332455 | A1* | 10/2019 | Ma | G06F 3/0679 |

OTHER PUBLICATIONS

Dell.com, "Proactive Copy (PACO) introduction," Oct. 18, 2015, hllps://www.dell.com/community/Enterprise-Support/Proactive-Copy-PACO-introduction/td-p/7056195, 5 pages.

* cited by examiner

*Primary Examiner* — Chae M Ko

(74) *Attorney, Agent, or Firm* — Amin, Turocy & Watson, LLP

(57) ABSTRACT

The described technology is generally directed towards proactive disk recovery that operates when a failing disk is detected in a data-protected cloud data storage system. A proactive recovery process evaluates the chunks of a failing disk one-by-one. If a system process is scheduled to handle that chunk, the chunk is skipped, with recovery delegated to the system process. For non-delegated chunks protected by mirroring, a chunk copy is read by the proactive disk recovery process from a good disk copy, and copied to a new location. For non-delegated chunks protected by erasure coding, the chunk fragment is read and validated. If a portion is consistent, the proactive recovery process stores the portion to a new location on a good disk. If a portion is inconsistent, the process initiates recovery of the portion, e.g., via a fragment recovery task, for copying to a new location on a good disk.

20 Claims, 13 Drawing Sheets

PROACTIVE DISK RECOVERY OF STORAGE MEDIA FOR A DATA STORAGE SYSTEM

TECHNICAL FIELD

The subject application generally relates to data storage, and, for example, to a data storage system of nodes that recover from disk failures, and related embodiments.

BACKGROUND

Contemporary cloud-based and other data storage systems, such as ECS provided by DELL EMC, use hard disk drives. Such hard disk drives tend to die in two ways, namely suddenly, or according to a gradual failure pattern over a period of time that is relatively consistent and easy to detect. Conventional storage systems can detect disks that are going bad/starting to fail and perform proactive recovery, which is relatively resource efficient compared to normal recovery.

The conventional proactive recovery for a disk that is failing works by reading data portions from the bad disk, one by one. The proactive recovery logic validates each data portion it reads. If a portion is consistent, the process stores the portion to a new location outside the bad disk. If a portion is inconsistent, the process recovers the portion using available data and redundant data. While this proactive recovery solution works, proactive recovery of a failing disk can be improved.

BRIEF DESCRIPTION OF THE DRAWINGS

The technology described herein is illustrated by way of example and not limited in the accompanying figures in which like reference numerals indicate similar elements and in which.

DETAILED DESCRIPTION

Figure 1:
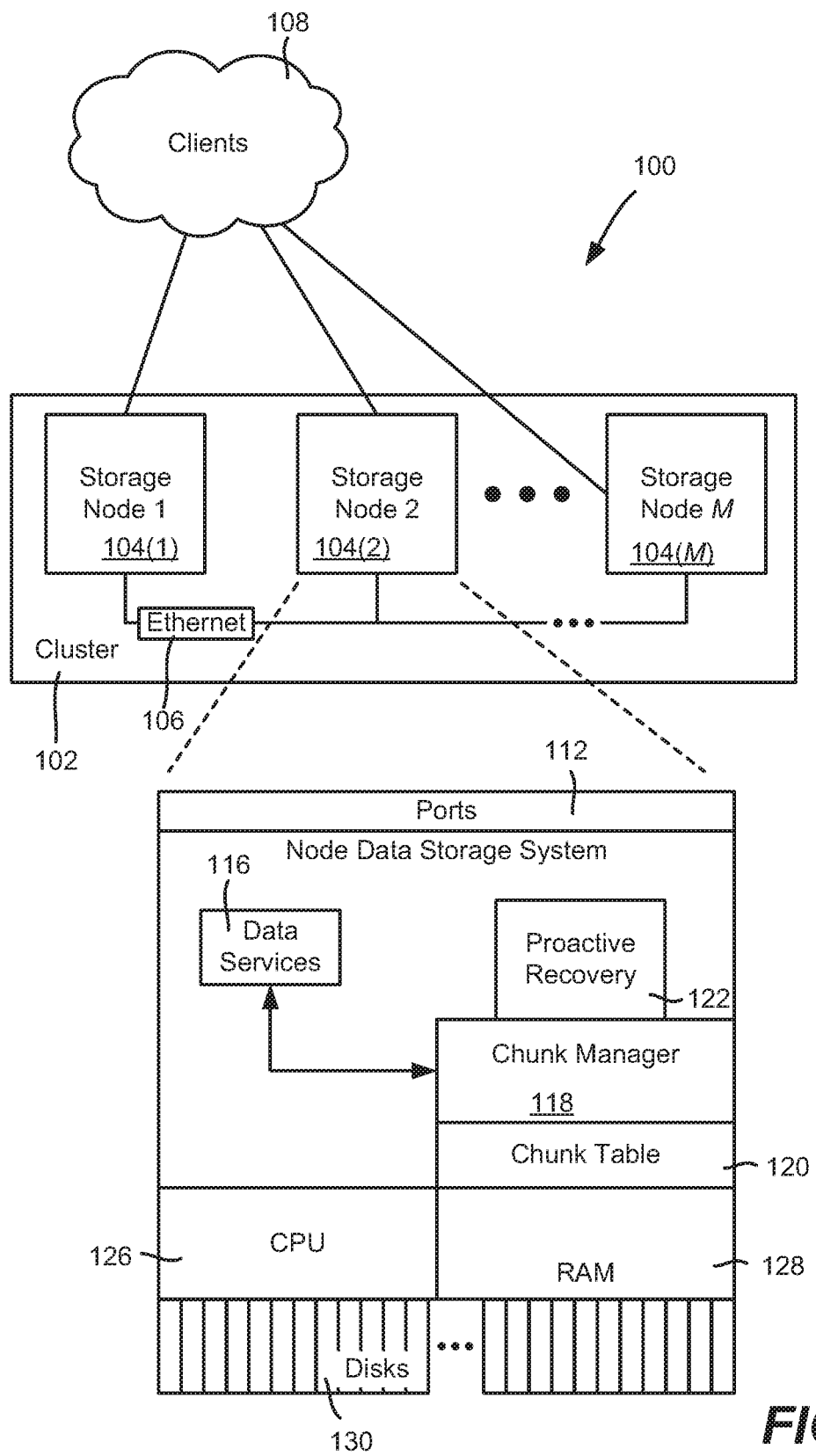
FIG. 1 is an example block diagram representation of part of a cloud data storage system including nodes, in which a proactive recovery process recovers chunks from a failing disk, in accordance with various aspects and implementations of the subject disclosure.

Various aspects of the technology described herein are generally directed towards proactive disk recovery that for a failing disk, copies each data storage unit, referred to herein as a data portion, or chunk, from a good disk that has a copy of the chunk to a new storage location. In general, a disk that is going bad is a less reliable source of the data than good disks, whereby the data is read from more reliable sources, unlike conventional proactive recovery.

Moreover, a data storage system such as ECS has a plurality of system processes that work in the background to operate on stored data. Because those processes access data, including data stored on a failing disk, those processes can participate in proactive recovery to make proactive recovery more efficient.

As will be understood, the implementation(s) described herein are non-limiting examples, and variations to the technology can be implemented. For instance, many of the examples herein are based on ECS, however the technology is applicable to any data storage system that has protected data and disks that can fail. Indeed, although the term "chunk" is used herein to represent any data storage unit or data portion, the term "chunk" is not limited to ECS chunks, but rather represents any data storage units, such as corresponding to the fragment level or the stripe level in other storages systems. Further, any storage medium in which upcoming failure can be detected, As such, any of the embodiments, aspects, concepts, structures, functionalities, implementations and/or examples described herein are non-limiting, and the technology may be used in various ways that provide benefits and advantages in data storage in general.

Reference throughout this specification to "one embodiment," "an embodiment," "one implementation," "an implementation," etc. means that a particular feature, structure, or characteristic described in connection with the embodiment/implementation is included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, or characteristics may be combined in any suitable manner in one or more embodiments/implementations.

Aspects of the subject disclosure will now be described more fully hereinafter with reference to the accompanying drawings in which example components, graphs and operations are shown. In the following description, for purposes of explanation, numerous specific details are set forth in order to provide a thorough understanding of the various embodiments. However, the subject disclosure may be embodied in many different forms and should not be construed as limited to the examples set forth herein.

In ECS, disk space is partitioned into a set of blocks of fixed size called chunks. The various types of data, including user data and various types of metadata, are stored in chunks. For example, there are different types of chunks, one type per capacity user; user data is stored in repository chunks, while the metadata is stored in directory tables, where each directory table (DT) is a set of key-value search trees. Chunks of each type can be shared. For instance, one repository chunk may contain segments of several user objects, one tree chunk may contain elements of several trees, and so on.

ECS protects data/metadata at the chunk level. Triple mirroring is a base protection scheme for chunks of the various types. For repository chunks, once they are filled up with user data, the system re-protects them using erasure coding. More particularly, re-protection of a chunk works by having a node read the chunk into its volatile memory. The chunk is divided into k fragments. During encoding, redundant m coding fragments are created, and the resulting k+m chunks are stored to different nodes/disks. The way the coding is performed assures that the system can tolerate the loss of any m fragments. When some fragments are lost, the missing fragments are recovered via a decoding operation.

When a node or a disk suddenly fails, ECS recovers the data that the node/disk used to store. In the recovery process, ECS finds the chunks that the node/disk used to store, and recovers the chunks one by one to a new location. If a chunk is protected with mirroring, the missing copy of the chunk is recovered to a mirroring location using one of the available mirror copies, e.g., some node of the cluster reads an available chunk copy into its volatile memory and stores that copy to a new location. If a chunk is protected with erasure coding, the missing fragments are recovered via a decoding operation corresponding to the erasure coding operation; some node of the cluster reads the available data/coding fragments of the chunk into its volatile memory, performs decoding, and stores the recovered fragments to new locations.

For even more robust protection, ECS that supports geographically distributed setups comprising two or more geographic zones. Geographic zones can be used to provide additional protection of user data by means of replication, which also works at the chunk level, asynchronously. To this end, after new data/metadata is stored to non-volatile memory, some node of the cluster reads the data/metadata into a volatile memory and sends the data/metadata to a replication destination zone.

FIG. 1 shows part of a cloud data storage system 100 (such as ECS) comprising a node cluster 102 of storage nodes 104(1)-104(M), in which each node is typically a server configured primarily to serve objects in response to client requests. The nodes 104(1)-104(M) are coupled to each other via a suitable data communications link comprising interfaces and protocols, such as represented in FIG. 1 by Ethernet block 106.

Clients 108 make data system-related requests to the cluster 102, which in general is configured as one large object namespace; there may be on the order of billions of objects maintained in a cluster, for example. To this end, a node such as the node 104(2) (shown enlarged in FIG. 1 as well) generally comprises ports 112 by which clients connect to the cloud storage system. Example ports are provided for requests via various protocols, including but not limited to SMB (server message block), FTP (file transfer protocol), HTTP/HTTPS (hypertext transfer protocol) and NFS (Network File System); further, SSH (secure shell) allows administration-related requests, for example.

Each node, such as the node 104(2), includes instances of data services 116, and a chunk manager 118 (one of ECS storage services) that manages one or more chunk tables 120. Note that some of data services can be per-cluster, rather than per-node. As will be understood, a proactive recovery component 122 can proactively recover a failing disk; further, one or more of the data services 116 can participate in proactive recovery.

In FIG. 1, a CPU 126 and RAM 128 are shown for completeness; note that the RAM 126 may comprise at least some non-volatile RAM. The node 104(2) further includes storage devices such as disks 130, comprising hard disk drives and/or solid-state drives, or any other suitable type of storage resource. Replication to a remote geographic zone or zones is not explicitly shown in FIG. 1, but is understood to be available in such a cloud storage system 100.

Figure 2:
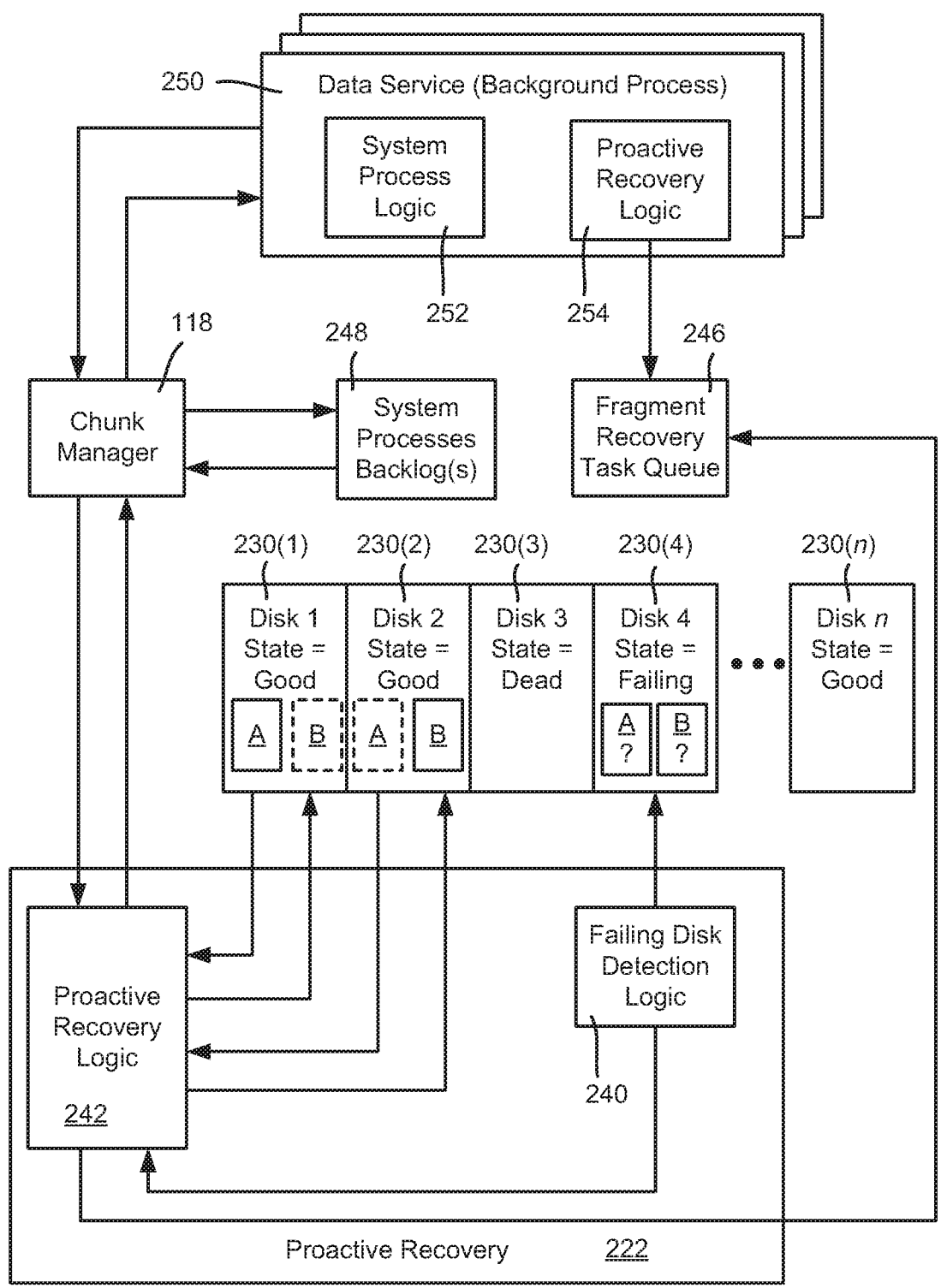
FIG. 2 is an example block diagram representation of components related to proactive recovery of a failing disk, in accordance with various aspects and implementations of the subject disclosure.

With respect to proactive recovery as described herein, as represented in FIG. 2, a proactive recovery component 222 (e.g., implemented on a node such as the node 102(2) of FIG. 1) operates to recover a failing disk as described herein. In general, a node can operate to proactively recover any of its own failing disks, but can also proactively recover another node's failing disk.

In the example of FIG. 2, consider that there a number of disks 230(1)-230(n), and the node 230(4) has been detected as failing, e.g., by failing disk detection logic 240 that recognizes a failure pattern, e.g., based on some number of failed disk access attempts over some period of time. As shown in FIG. 2, the failing disk detection logic 240 is shown as being incorporated into the proactive recovery component 222, but as is understood, can be an independent component of a node or possibly extend over a plurality of nodes. In any event, in this example the failing disk detection logic 240 triggers the proactive recovery logic 242 of the proactive recovery component 222 when disk 230(4) is deemed to be failing; the state of the disk 230(4) is set to "failing" or the like, e.g., on the disk, in a node or cluster-accessible data store, and/or at the chunk manager 118, or the like. Note for purposes of illustration, the disk 230(3) has been previously set to a "dead" state and will at some point be physically replaced; other disks 230(1), 230(2) and 230(n) that depicted in FIG. 2 are in a "good" state, that is, in a non-failing state (unless and until deemed otherwise, e.g., by the failing disk detection logic 240).

As will be understood, the proactive recovery logic 242 operates to copy chunks of a failing disk from a good disk to a new location on a different good disk. Thus, in the example of FIG. 2, the proactive recovery logic 242 communicates with the chunk manager 118 to determine which chunks (or fragments) are on the failing disk, which in this simplified example comprise chunks (or fragments) A and B.

Consider that in the example of FIGS. 2, A and B are full chunks protected via mirroring. Unlike conventional proactive recovery that attempts to validate whether the chunks on the failing disks can be used, the proactive recovery logic 242 logically moves the chunk as described herein, that is, the proactive recovery logic 242 obtains a copy of the chunk A from a good disk 230(1), and copies the chunk A to another good disk 230(2) in this example, as represented by the dashed chunk representation "A" on the disk 230(2). Similarly, the proactive recovery logic 242 described herein obtains a copy of the chunk B from a good disk 230(2), and copies the chunk B to another good disk 230(1) in this example, as represented by the dashed chunk representation "B" on the disk 230(1). Note that the good disks can be anywhere in the cluster, and indeed can be geographically remote relative to the node on which the proactive recovery logic 242 is running.

If instead one or more of the chunks are protected via erasure coding, the proactive recovery logic 242 logically moves the fragment; the proactive recovery logic 242 needs to read the data (or coding data) of the chunk's fragment and perform a validation operation on the fragment. If the fragment is consistent, the proactive recovery logic 242 stores the fragment to a new location; (this "move" can be considered a "logical" move because the old fragment on the failing disk need not actually be moved from the failing disk, just denoted as having been recovered). If a portion is inconsistent, the proactive recovery logic 242 enqueues a recovery task for the chunk, e.g., in a fragment recovery task queue 246.

In another aspect, while the proactive recovery logic 242 is handling the chunks (one by one), for each chunk the process checks if the chunk is in a backlog 248 of any system process. Example system processes include, but are not limited to, recovery, encoding, replication, garbage collection or any other data service/process that works at the chunk level. The information as to whether the chunk is in a backlog 248 or not can be obtained from the chunk manager 118.

If the chunk is in a backlog 248 of some other chunk-level process, the proactive recovery logic 242 skips that chunk and goes to a next one. The general idea is not to read one chunk twice, because system process logic 252 of the background data service process 250 will handle (read) the chunk in the near future anyway. As described herein, the background process 250 includes its own proactive recovery logic 254, and thus will handle proactive recovery for that chunk. The proactive recovery logic 242 thus delegates the recovery operation to the other system process 250.

Figure 3:
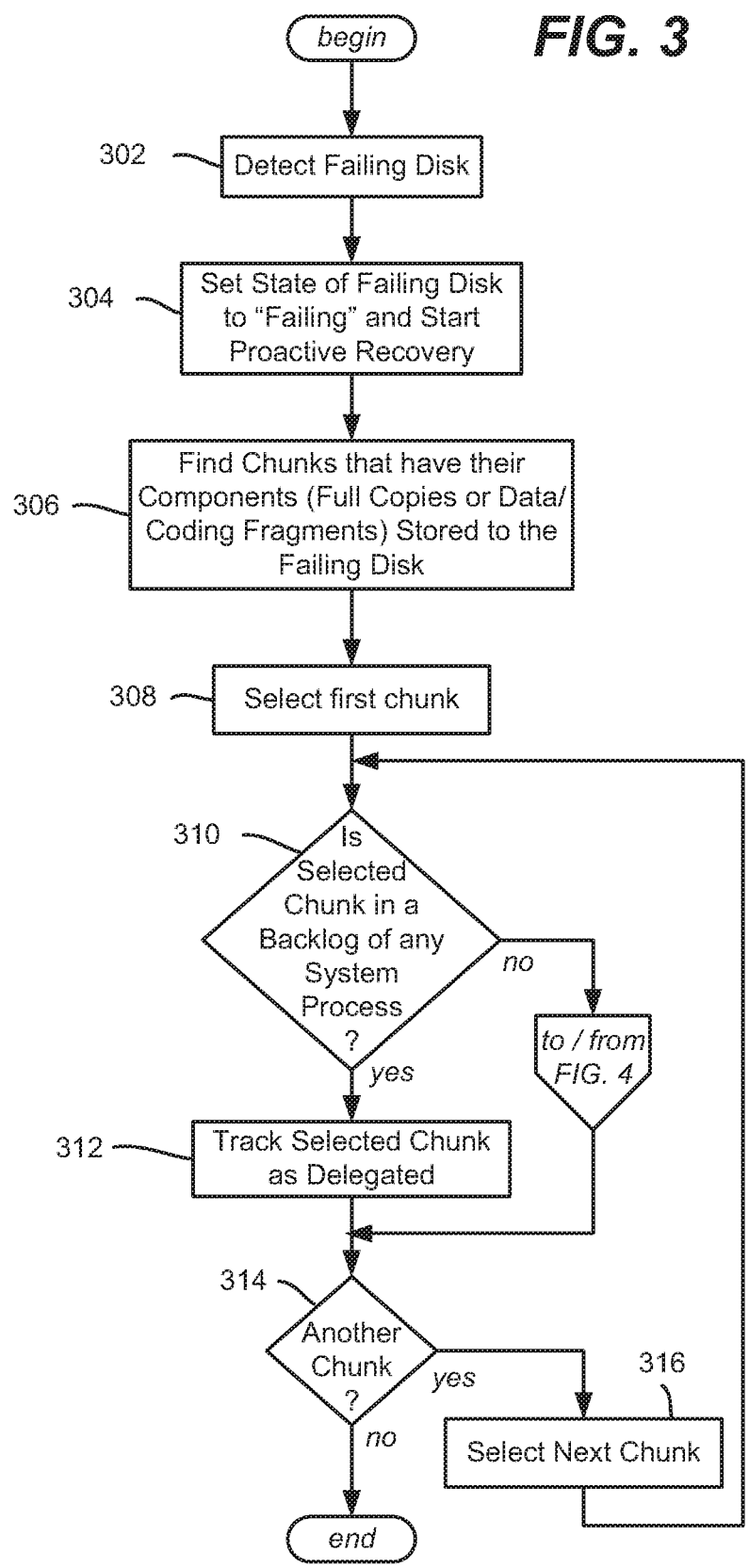
FIGS. 3 and 4 comprise a flow diagram showing example operations of a proactive disk recovery process, in accordance with various aspects and implementations of the subject disclosure.

FIG. 3 summarizes example operations of a system/process that performs proactive recovery as described herein. Operation 302 represents detecting a disk that is failing (going bad), and operation 304 changes the disk's state appropriately, and starts proactive recovery.

At operation 306, the proactive recovery logic (process) finds the chunks that have their components (full copies or data/coding fragments) stored to the failing disk. The proactive recovery process handles the chunks one by one, as represented by operations 308, 314 and 316. For each chunk, at operation 310 the proactive recovery process checks if the chunk is in a backlog of any system process that works at the chunk level, e.g., via information provided by the chunk manager as described above.

If the chunk is in a backlog of some other process, the proactive recovery process skips the chunk and goes to a next one, until none remain. When the proactive recovery process delegates recovery to another system process, operation 312 tracks the selected chunk as having been delegated, so that, for example, if the other process does not handle recovery for whatever reason (e.g., in a timely manner), the proactive recovery process can retake responsibility for recovery of that chunk as described below.

Figure 4:
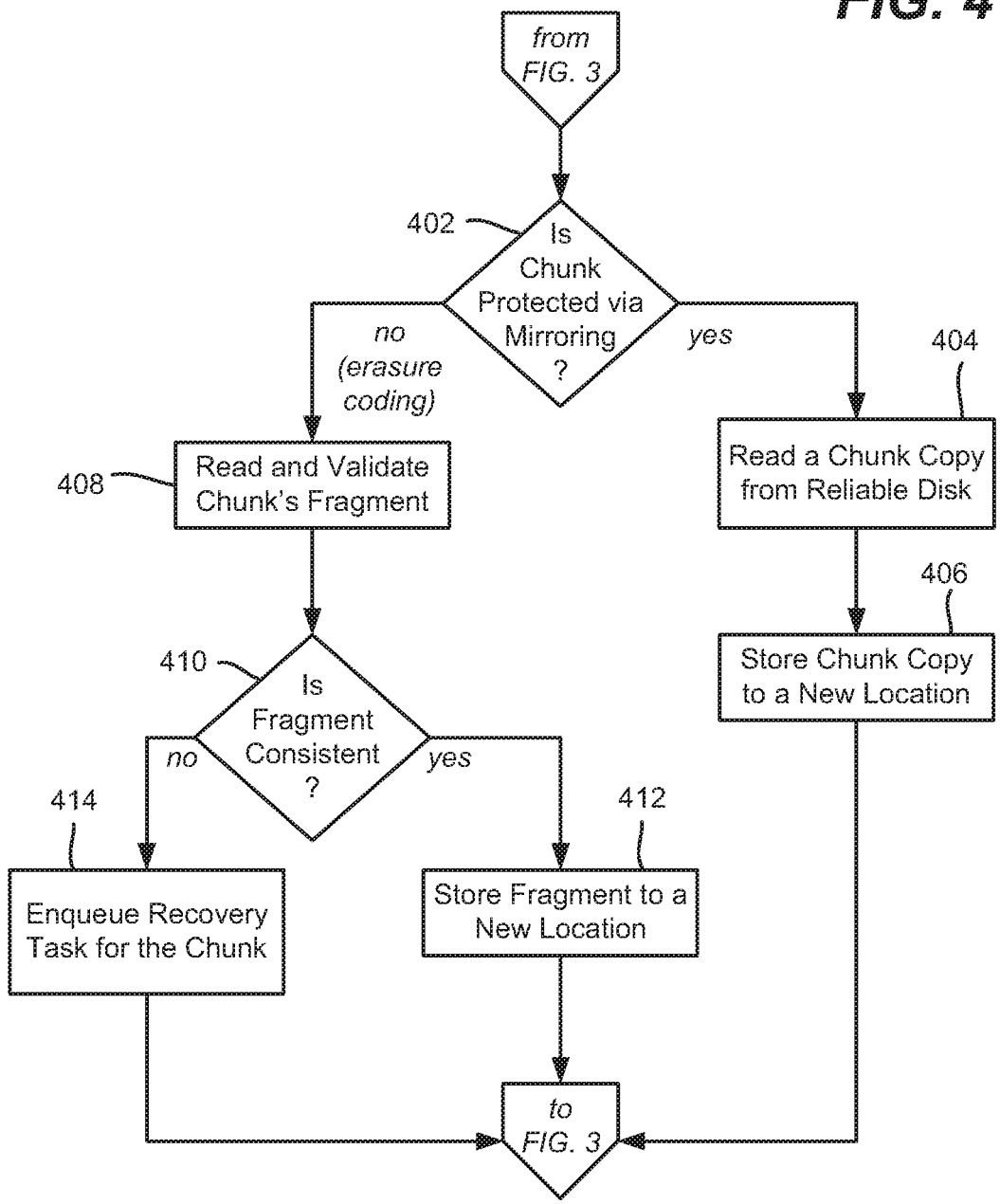

If the chunk is not in backlogs of other processes, the proactive recovery process branches to operation 402 of FIG. 4. The way the proactive recovery process handles the chunk depends on the way the chunk is protected.

If the chunk is protected via mirroring as evaluated at step 402, the proactive recovery process does not read the chunk copy from the less reliable bad disk, but rather reads a chunk copy from one of the more reliable good disks at operation 404. The copy is stored to a new location instead of the copy in the bad disk as represented via operation 406. The process then returns to FIG. 3 to recover other chunks, until none remain (at least for now).

If instead the chunk is protected using erasure coding, at operation 408 the proactive recovery process reads the data (or coding data) from the failing disk (reading a fragment is the only time failing disk data needs to be accessed), and validates the chunk's fragment. If the fragment is consistent at operation 410, the proactive recovery process stores the fragment to a new location as represented by operation 412. If any portion is inconsistent, the proactive recovery process enqueues a recovery task for the chunk at operation 414. Note that the fragment recovery task operates in a known manner, and is not described herein in more detail. Further, it should be noted that the proactive recovery process can track the fragment to ensure the fragment recovery task indeed recovers the fragment.

Figure 5:
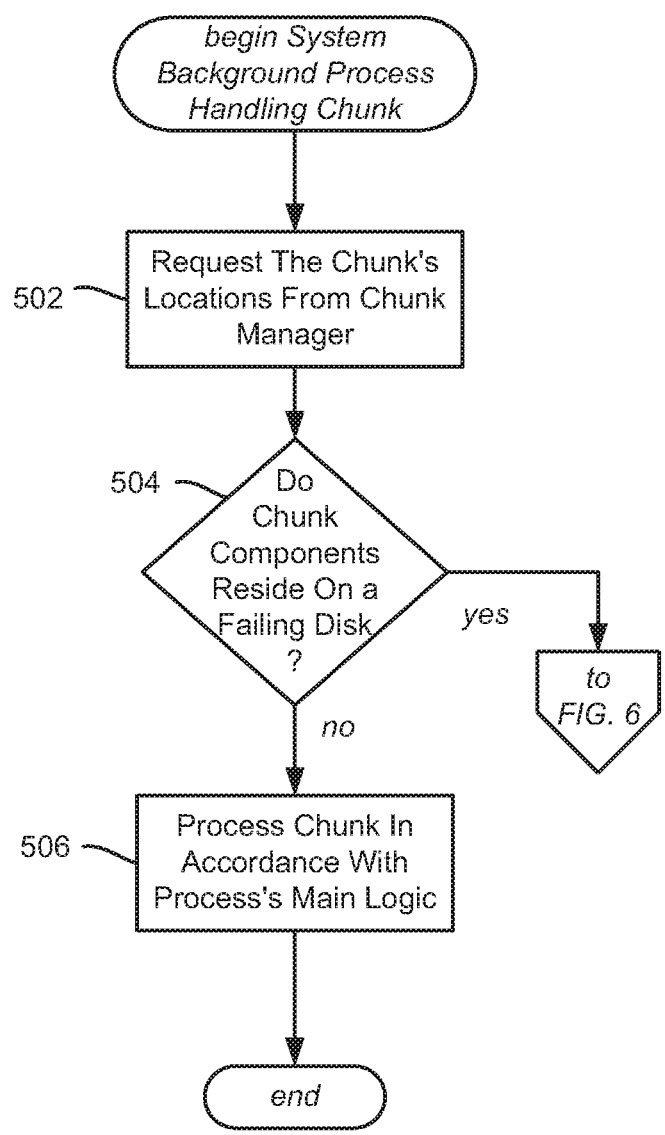
FIGS. 5 and 6 comprise a flow diagram showing example operations of a system process that participates in proactive disk recovery, in accordance with various aspects and implementations of the subject disclosure.
Figure 6:
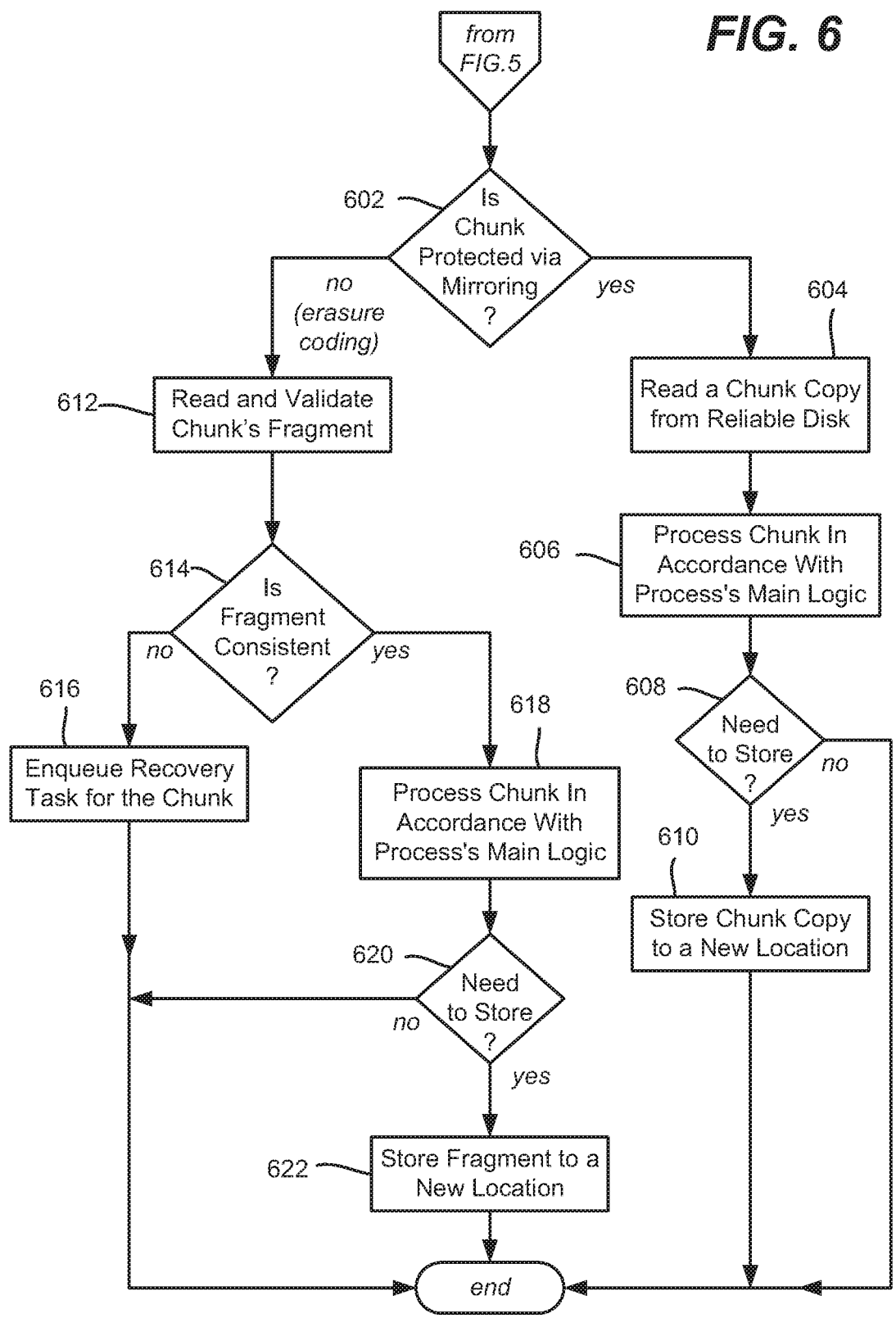

As described herein, existing system background processes, which work at the chunk level, may contribute to proactive disk recovery via implementing the recovery logic of FIGS. 5 and 6. When a system background process is handling a chunk, at operation 502 the system background process requests the chunk's locations from the chunk manager. If one of the chunk components resides a disk that is failing, as evaluated via operation 504, the system background process handles the chunk according to the logic of FIG. 6. Otherwise the system background process processes the chunk in accordance with the system background process's main logic (e.g., 252 in FIG. 2) at operation 506.

As shown via operation 602 of FIG. 6, if the chunk is on a failing disk and is protected via mirroring, at operation 604 the system background process reads a chunk copy from a good disk location. Operation 606 processes the chunk in accordance with the system background process's main logic.

Operation 608 (which depends on the purpose of background process's main logic) along with operation 610 represents optionally storing a new chunk copy to a new location, thereby replacing the copy in the failing disk. Note that storing a chunk copy to a new location is "optional" because storing or not depends on the purpose of background process's main logic; the system background process's purpose may make storage needless. For example, if the process is an encoding process, the process re-protects chunk data with erasure coding, and after encoding for a chunk is over, the complete (mirrored) chunk copies are deleted. Another example is a garbage collection process, in which live data from a low capacity use chunk is read and stored to one or more new chunks; the old chunk gets deleted. If the system background process does not delete the chunk, then a chunk copy is stored to a new location via operation 610.

Returning to operation 602, if the chunk is protected using erasure coding, the system background process reads and validates the chunk's fragment at operation 612. If the fragment is consistent, the process handles the chunk in accordance with the process's main logic at operation 618 and, again optionally (via operations 620 and 622) stores a new copy of the fragment to a new location replacing the copy in the failing disk. If the fragment is inconsistent, the process may enqueue a recovery task for the chunk as represented by operation 616.

It should be noted that the chunk handling process described above can be implemented in the form of a library, whereby different system processes do not need to repeat the recovery logic.

Any system process may "get stuck" or for some reason may work very slowly. As described above with reference to operation 312 of FIG. 3, the proactive recovery process may keep track of chunks that the proactive recovery process had delegated to another process for handling. The proactive recovery process may revert to handling the chunks after some timeout (e.g. after 48 hours). In this way, after the timeout expires, the process may handle chunks that still require handling.

The process of proactive recovery for a disk may finish when the disk does not contain any chunk copy/fragment that still requires recovery handling. At this moment the failing disk can be declared in the "dead" state, whereby no reactive recovery is required for such a disk.

Figure 7:
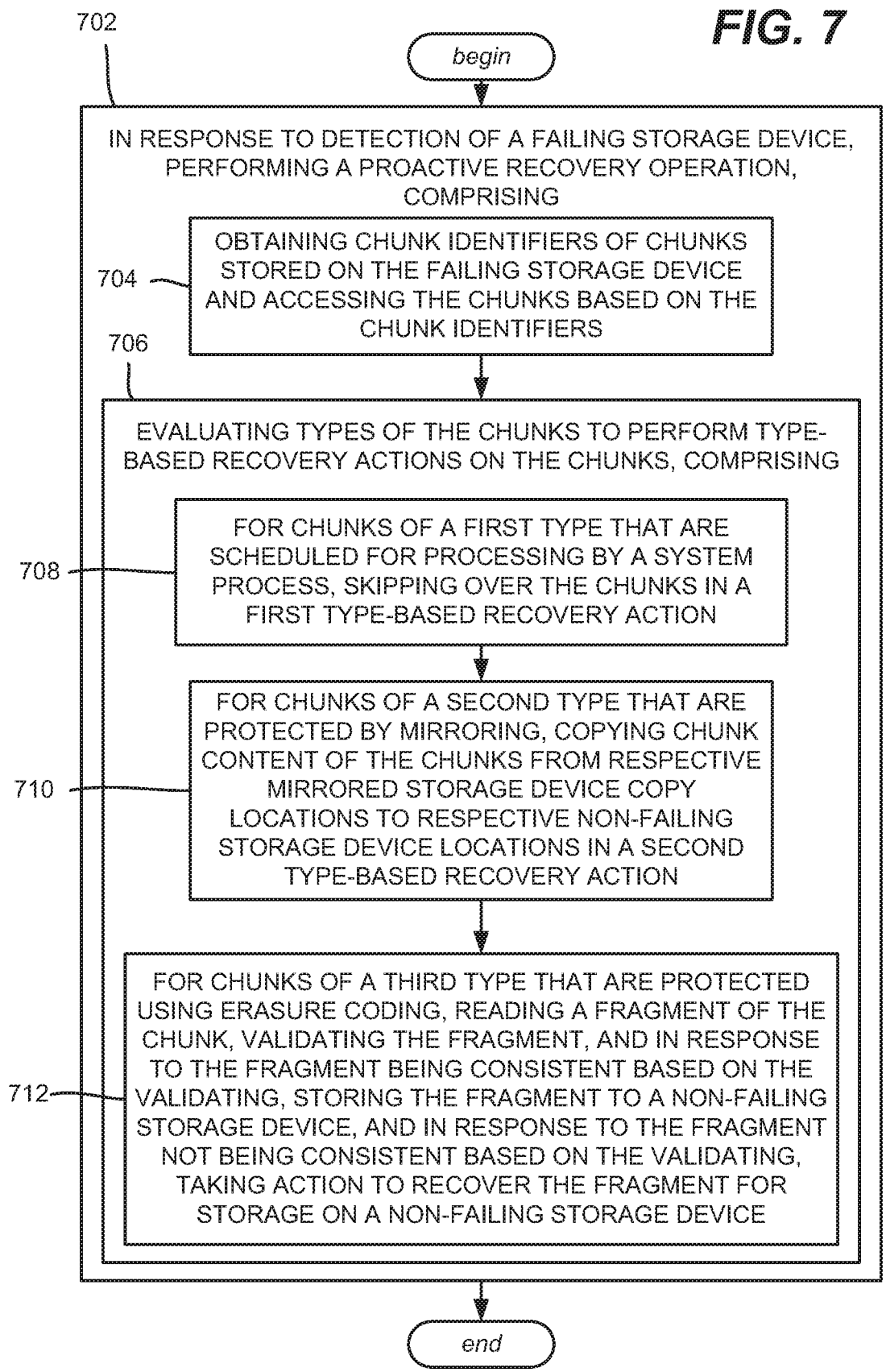
FIG. 7 is a flow diagram representation of example operations related to performing proactive disk recovery of chunks of varying types, in accordance with various aspects and implementations of the subject disclosure.

One or more example aspects are represented in FIG. 7, and can correspond to operations. Example operations comprise operation 702, which represents in response to detection of a failing storage device, performing a proactive recovery operation. The proactive recovery operation can comprise obtaining chunk identifiers of chunks stored on the failing storage device and accessing the chunks based on the chunk identifiers (operation 704), and evaluating types of the chunks to perform type-based recovery actions on the chunks (operation 706). The type-based recovery actions can comprise, for chunks of a first type that are scheduled for processing by a system process, skipping over the chunks in a first type-based recovery action (operation 708). Operation 710 represents an action for chunks of a second type that are protected by mirroring, comprising copying chunk content of the chunks from respective mirrored storage device copy locations to respective non-failing storage device locations in a second type-based recovery action. Operation 710 represents an action for chunks of a third type that are protected using erasure coding, comprising performing a third type-based recovery action comprising reading a fragment of the chunk, validating the fragment, and in response to the fragment being consistent based on the validating, storing the fragment to a non-failing storage device, and in response to the fragment not being consistent based on the validating, taking action to recover the fragment for storage on a non-failing storage device.

Taking the action to recover the fragment for storage on a non-failing storage device can comprise enqueuing a recovery task for the chunk.

Further operations can comprise setting a state of the failing storage device to a value that indicates that the storage device is failing.

Further operations can comprise tracking chunks of the first type as tracked chunks. Further operations can comprise determining whether respective ones of the tracked chunks have been processed by a respective system process within a respective time duration, and in response to determining that the respective ones of the tracked chunks have been processed by a respective system process within a respective time duration, denoting the tracked chunks as recovered.

Further operations can comprise determining that a tracked chunk has not been processed by the respective system process within the respective time duration, and in response, determining whether the second chunk is protected by mirroring or protected using erasure coding. In response to determining that the second chunk is protected by mirroring, operation(s) can comprise copying chunk content of the chunks from a mirrored storage device copy location to a non-failing storage device location. In response to determining that the tracked chunk is protected using erasure coding, operation(s) can comprise reading a fragment of the tracked chunk, validating the fragment, and in response to the fragment being consistent based on the validating, storing the fragment to a non-failing storage device, and in response to the fragment not being consistent based on the validating, taking further action to recover the fragment for storage on a non-failing storage device.

Further operations can comprise determining that the proactive recovery operation is complete, and in response to the determining, setting a state of the failing storage device to a value that indicates that the storage device is dead.

Figure 8:
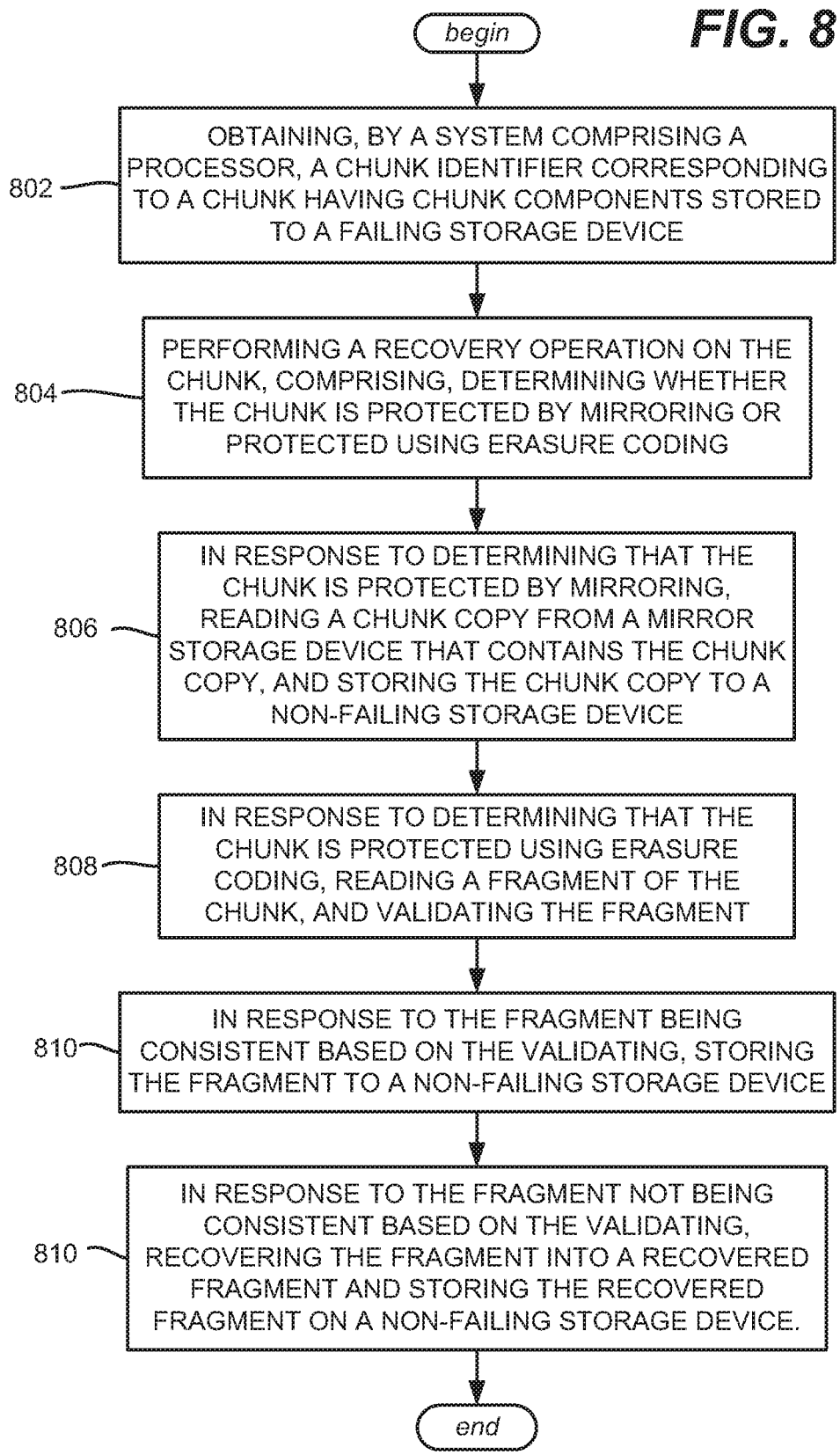
FIG. 8 is a flow diagram representation of example operations related to performing proactive disk recovery for chunks protected by mirroring or erasure coding, in accordance with various aspects and implementations of the subject disclosure.

One or more aspects, generally exemplified in FIG. 8, can comprise example operations. Operation 802 represents obtaining, by a system comprising a processor, a chunk identifier corresponding to a chunk having chunk components stored to a failing storage device. Operation 804 represents performing a recovery operation on the chunk, comprising, determining whether the chunk is protected by mirroring or protected using erasure coding. Operation 806 represents, in response to determining that the chunk is protected by mirroring, reading a chunk copy from a mirror storage device that contains the chunk copy, and storing the chunk copy to a non-failing storage device. Operation 808 represents, in response to determining that the chunk is protected using erasure coding, reading a fragment of the chunk, validating the fragment. Operation 810 represents in response to the fragment being consistent based on the validating, storing the fragment to a non-failing storage device. Operation 812 represents in response to the fragment not being consistent based on the validating, recovering the fragment into a recovered fragment and storing the recovered fragment on a non-failing storage device.

Recovering the fragment can comprise enqueuing a recovery task for the chunk.

Further operations can comprise detecting the failing storage device, and setting a state of the failing storage device to a value that indicates that the storage device is failing.

The chunk can be a first chunk, and further operations can comprise, obtaining a second chunk having chunk components stored to the failing storage device, evaluating whether the second chunk is in a backlog to be processed a system process, and in response to determining that the second chunk is in a backlog to be processed a system process, delegating recovery of the second chunk to the system process.

In response to determining that the second chunk is not in a backlog to be processed a system process, aspects can comprise determining whether the second chunk is protected by mirroring or protected using erasure coding, and in response to determining that the second chunk is protected by mirroring, aspects can comprise reading a second chunk copy from a mirror storage device, and storing the second chunk copy to a non-failing storage device. In response to determining that the second chunk is protected using erasure coding, aspects can comprise reading a fragment of the second chunk, validating the fragment, and in response to the fragment of the second chunk being consistent based on the validating, storing the fragment of the second chunk to a non-failing storage device. In response to the fragment of the second chunk not being consistent based on the validating, aspects can comprise recovering the fragment into a recovered fragment and storing the recovered fragment on a non-failing storage device.

The second chunk can be in a backlog to be processed a system process, and further operations can comprise, tracking the second chunk as being delegated for recovery to a system process. Aspects can comprise determining whether the second chunk has been processed by the system process within a time duration, and in response to determining that the second chunk has been processed by the system process within the time duration, denoting the second chunk as recovered.

Further operations can comprise determining whether the second chunk has been processed by the system process within a time duration, and in response to determining that the second chunk has not been processed by the system process within the time duration, determining whether the second chunk is protected by mirroring or protected using erasure coding, and in response to determining that the second chunk is protected by mirroring, reading a second chunk copy from a mirror storage device, and storing the second chunk copy to a non-failing storage device, and in response to determining that the second chunk is protected using erasure coding, reading a fragment of the second chunk, validating the fragment of the second chunk, and in response to the fragment of the second chunk being consistent based on the validating, storing the fragment of the second chunk to a non-failing storage device, and in response to the fragment not being consistent based on the validating, recovering the fragment of the second chunk into a recovered fragment and storing the recovered fragment on a non-failing storage device.

Aspects can comprise detecting that the chunk is a last chunk to be recovered from the failing storage device, and in response to detecting that the chunk is a last chunk to be recovered from the failing storage device, setting a state of the failing storage device to a value that indicates that the storage device is dead.

Figure 9:
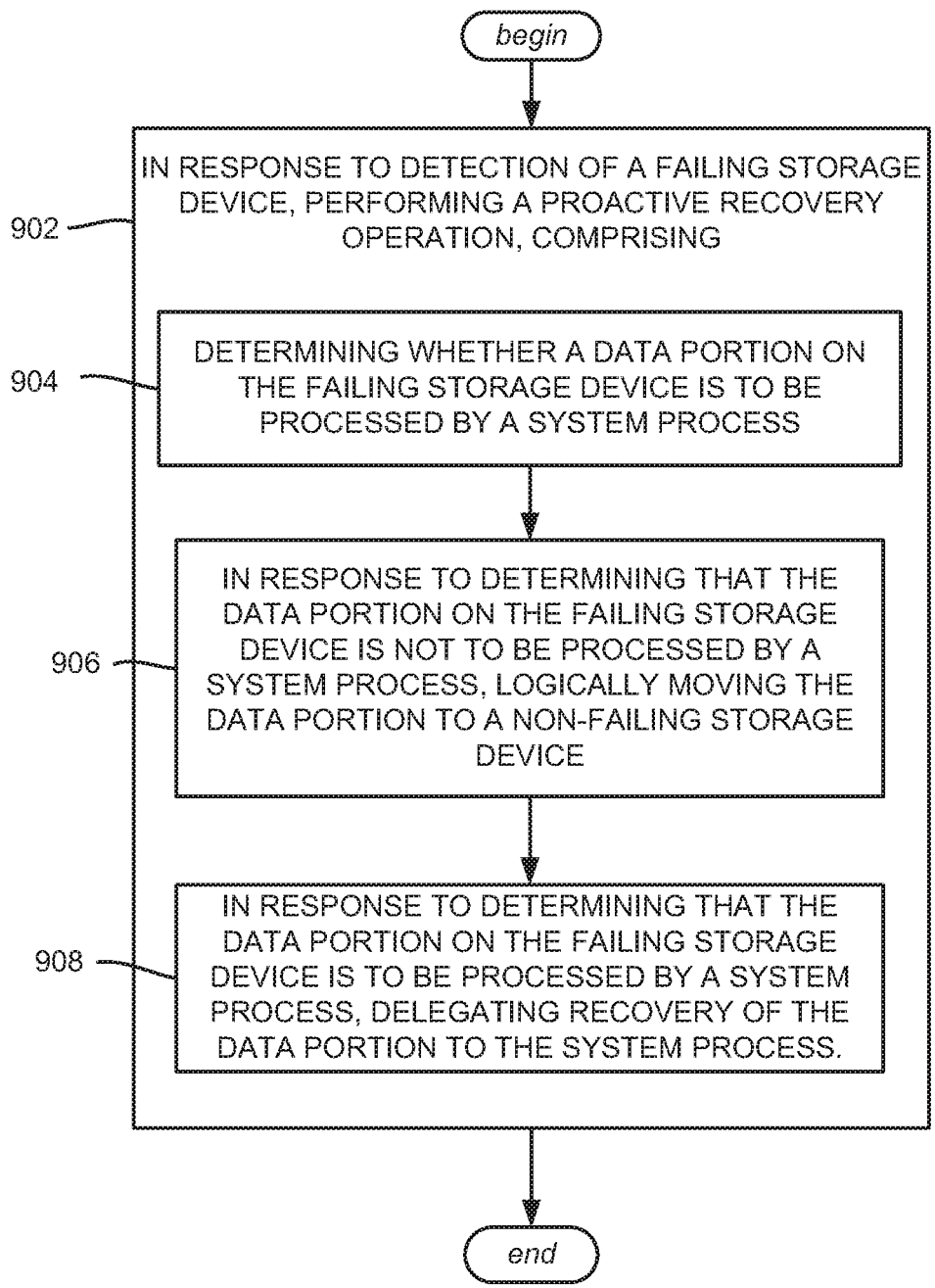
FIG. 9 is a flow diagram representation of example operations related to performing proactive recovery of a data portion depending on whether the data portion is to be processed by a system process, in accordance with various aspects and implementations of the subject disclosure.

One or more example aspects are represented in FIG. 9, and can correspond to a system comprising a processor and a memory that stores executable instructions that, when executed by the processor, facilitate performance of example operations. Operation 902 represents, in response to detection of a failing storage device, performing a proactive recovery operation. The performing the proactive recovery operation can comprise operation 904, which represents determining whether a data portion on the failing storage device is to be processed by a system process. Operation 906 represents, in response to determining that the data portion on the failing storage device is not to be processed by a system process, logically moving the data portion to a non-failing storage device. Operation 908 represents, in response to determining that the data portion on the failing storage device is to be processed by a system process, delegating recovery of the data portion to the system process.

The logically moving the data portion to the non-failing storage device can comprise determining that the data portion is protected by mirroring, reading a data portion copy from a mirror storage device that contains the data portion copy, and storing the data portion copy to the non-failing storage device.

The logically moving the data portion to the non-failing storage device can comprise determining that the data portion is protected using erasure coding, reading a fragment of the data portion, validating the fragment, and in response to the fragment being consistent based on the validating, storing the fragment to a non-failing storage device, and in response to the fragment not being consistent based on the validating, recovering the fragment into a recovered fragment and storing the recovered fragment on the non-failing storage device. Recovering the fragment into the recovered fragment and storing the recovered fragment on the non-failing storage device can comprise enqueuing a recovery task for the data portion.

When the data portion on the failing storage device is to be processed by the system process, further operation can comprise tracking the data portion as a tracked data portion having recovery delegated to the system process, determining whether the tracked data portion has been processed by the system process within a time duration, in response to determining that the tracked data portion has been processed by the system process within the time duration, denoting the tracked data portion as recovered, and in response to determining that the tracked data portion has not been processed by the system process within the time duration, logically moving the data portion to a non-failing storage device.

Further operations can comprise setting a state of the failing storage device to a value that indicates that the storage device is failing. Further operations can comprise determining that the proactive recovery operation is complete, and in response to the determining that the proactive recovery operation is complete, setting a state of the failing storage device to a value that indicates that the storage device is dead.

Figure 10:
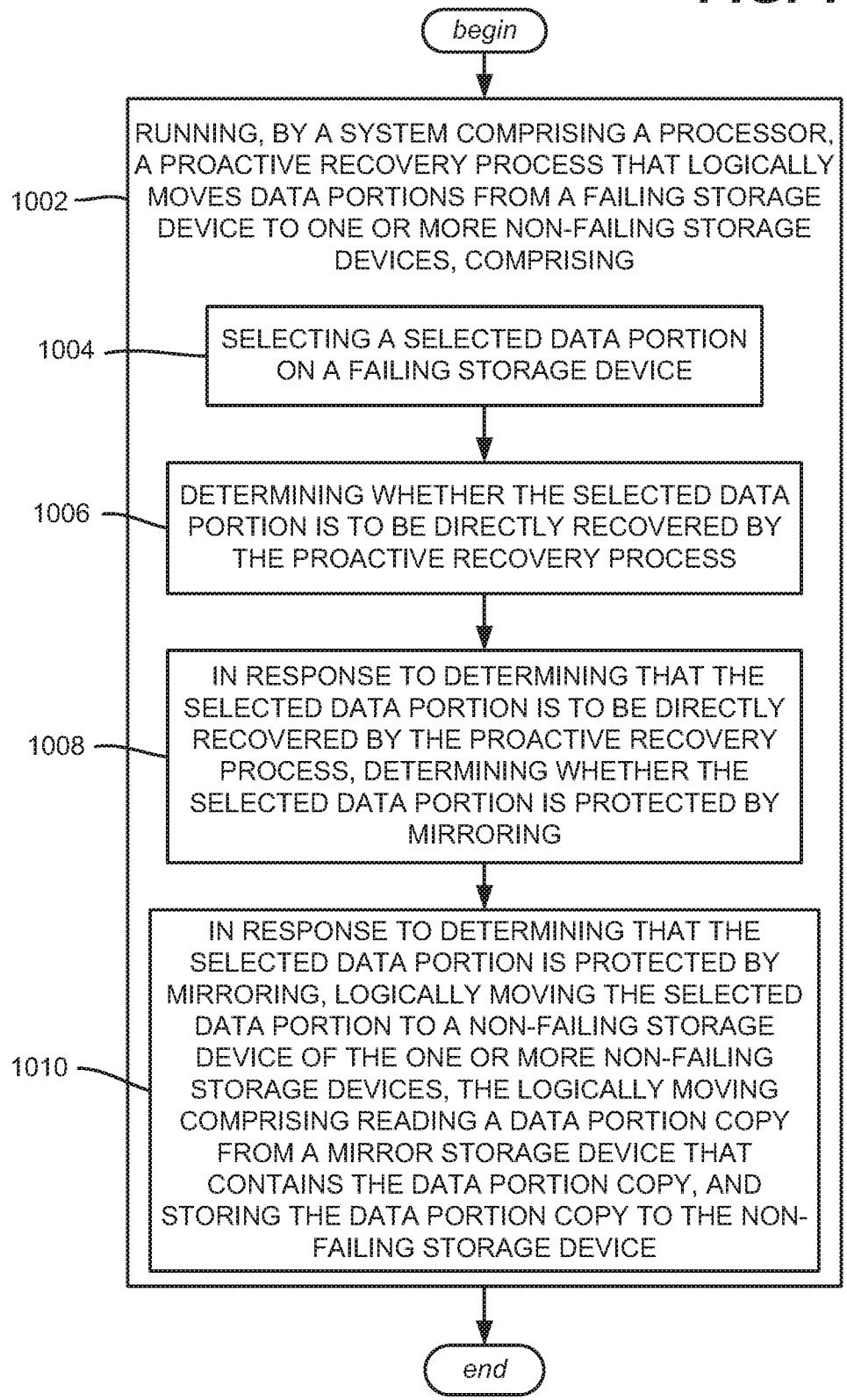
FIG. 10 is a flow diagram representation of example operations related to running proactive disk recovery for data portions on a failing disk, in accordance with various aspects and implementations of the subject disclosure.

One or more aspects, generally exemplified in FIG. 10, can comprise example operations, e.g., of a method. Operation 1002 represents running, by a system comprising a processor, a proactive recovery process that logically moves data portions from a failing storage device to one or more non-failing storage devices. Operation 1004 represents selecting a selected data portion on a failing storage device. Operation 1006 represents determining whether the selected data portion is to be directly recovered by the proactive recovery process. Operation 1008 represents, in response to determining that the selected data portion is to be directly recovered by the proactive recovery process, determining whether the selected data portion is protected by mirroring. Operation 1010 represents, in response to determining that the selected data portion is protected by mirroring, logically moving the selected data portion to a non-failing storage device of the one or more non-failing storage devices, the logically moving comprising reading a data portion copy from a mirror storage device that contains the data portion copy, and storing the data portion copy to the non-failing storage device.

Determining whether the selected data portion is to be directly recovered by the proactive recovery process can comprise establishing that the selected data portion is not to be directly recovered by the proactive recovery process, and, in response to the establishing that the selected data portion is not to be directly recovered by the proactive recovery process, delegating proactive recovery of the data portion to a system process.

Establishing that the selected data portion is not to be directly recovered by the proactive recovery process can comprise determining that the selected data portion is to be accessed by the system process.

Aspects can comprise tracking the selected data portion in response to establishing that the selected data portion is not to be directly recovered by the proactive recovery process. Aspects can comprise determining that the selected data portion has not been recovered by the system process within a time duration, and in response to the determining that the selected data portion has not been recovered by the system process within the time duration, logically moving the data portion to the non-failing storage device.

Determining whether the selected data portion is protected by mirroring can comprise determining that the selected data portion is not protected by mirroring and is protected by erasure coding, and in response to determining that the selected data portion is protected by erasure coding, recovering the selected data portion to the non-failing storage device, which can comprise reading a fragment of the selected data portion, validating the fragment, and in response to the fragment being consistent based on the validating, storing the fragment to the non-failing storage device.

In response to the fragment not being consistent based on the validating, aspects can comprise taking action to recover the selected data portion, which can comprise enqueuing a recovery task corresponding to the selected data portion.

Aspects can comprise detecting the failing storage device, and setting a state of the failing storage device to a value that indicates that the storage device is failing.

Aspects can comprise detecting that the selected data portion is a last data portion to be recovered from the failing storage device, and, in response to detecting that the selected data portion is the last data portion to be recovered from the failing storage device, setting a state of the failing storage device to a value that indicates that the storage device is dead.

Figure 11:
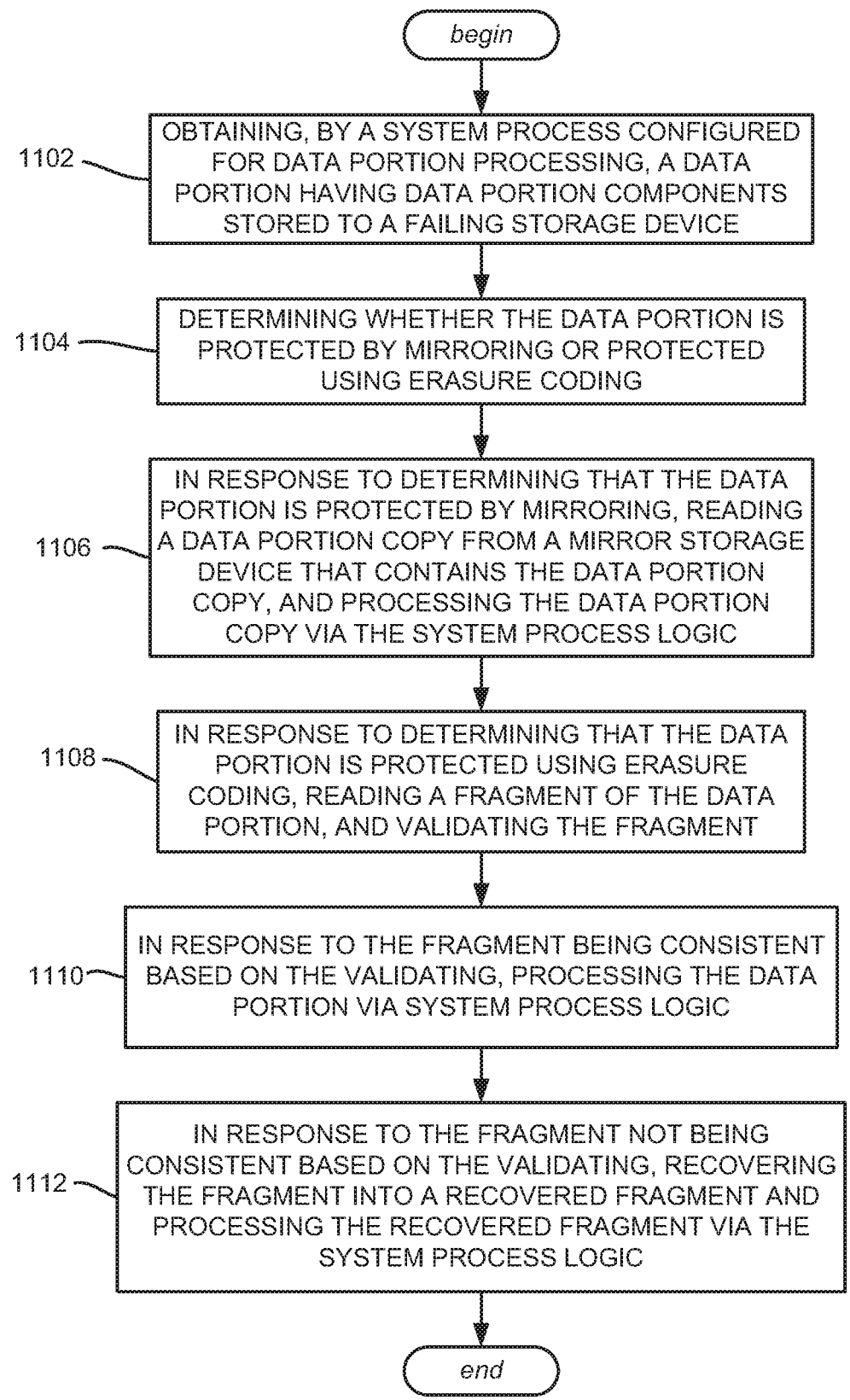
FIG. 11 is a flow diagram representation of example operations of a system process that participates in proactive disk recovery, in accordance with various aspects and implementations of the subject disclosure.

One or more aspects, such as implemented in a machine-readable storage medium, comprising executable instructions that, when executed by a processor, facilitate performance of operations, can be directed towards operations exemplified in FIG. 11. Example operation 1102 represents obtaining, using a system process configured for data portion (e.g., chunk) processing, a data portion having data portion components stored to a failing storage device. Example operation 1104 represents determining whether the data portion is protected by mirroring or protected using erasure coding. Example operation 1106 represents, in response to determining that the data portion is protected by mirroring, reading a data portion copy from a mirror storage device that contains the data portion copy, and processing the data portion copy via the system process logic. Example operation 1110 represents in response to determining that the data portion is protected using erasure coding, reading a fragment of the data portion, and validating the fragment. Example operation 1112 represents, in response to the fragment being consistent based on the validating, processing the data portion via system process logic of the system process. Example operation 1114 represents in response to the fragment not being consistent based on the validating, recovering the fragment into a recovered fragment and processing the recovered fragment via the system process logic.

Recovering the fragment can comprise enqueuing a recovery task for the data portion.

Further operations can comprise, in response to determining that the data portion is protected by mirroring, storing the data portion copy to a non-failing storage device. Further operations can comprise, in response to determining that the data portion is protected using erasure coding, and in response to the fragment being consistent based on the validating, storing the data portion copy to a non-failing storage device.

As can be seen, described herein is a proactive disk recovery technology that is highly resource efficient because of using reliable sources of data whenever possible. Moreover, the proactive disk recovery technology described herein eliminates the double handling of chunks a proactive disk recovery process and another different system process (es).

Figure 12:
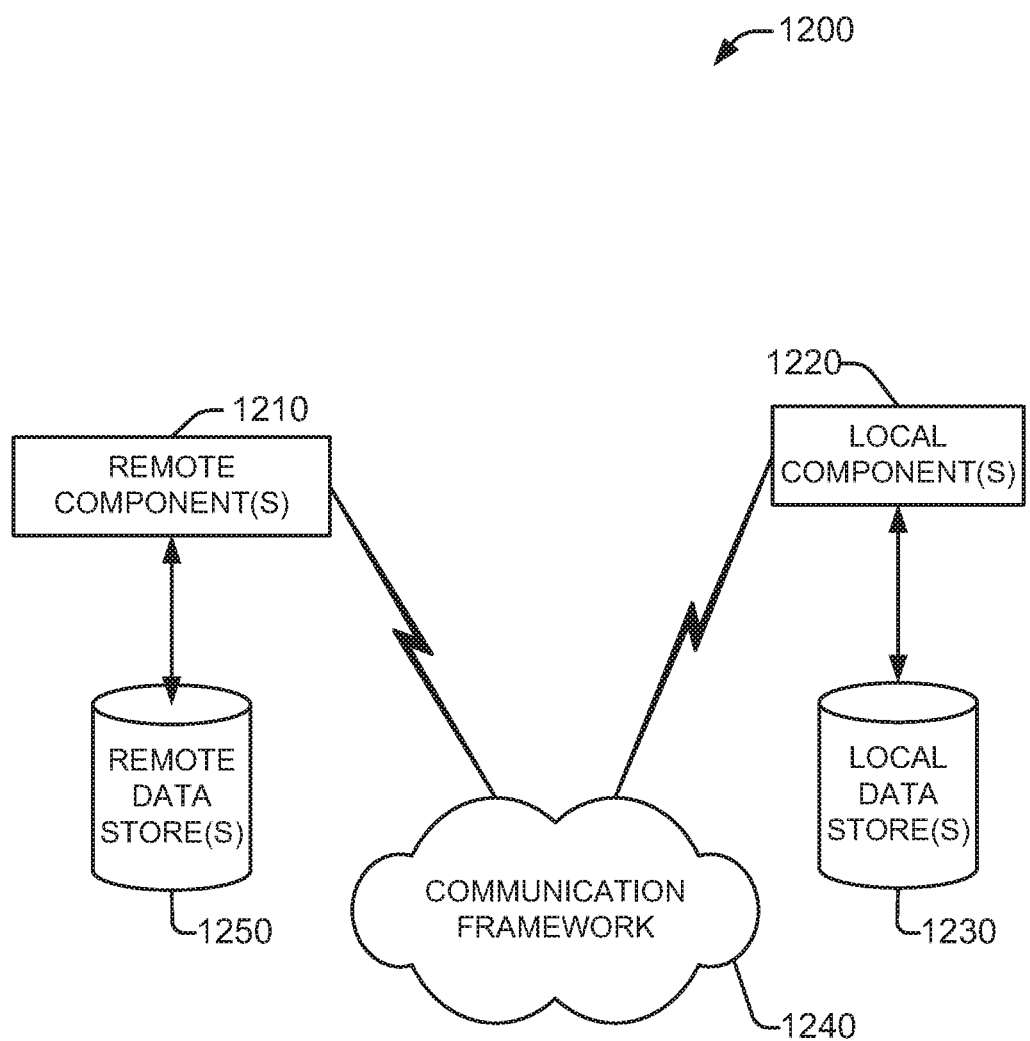
FIG. 12 depicts an example schematic block diagram of a computing environment with which the disclosed subject matter can interact, in accordance with various aspects and implementations of the subject disclosure.

FIG. 12 is a schematic block diagram of a computing environment 1200 with which the disclosed subject matter can interact. The system 1200 comprises one or more remote component(s) 1210. The remote component(s) 1210 can be hardware and/or software (e.g., threads, processes, computing devices). In some embodiments, remote component(s) 1210 can be a distributed computer system, connected to a local automatic scaling component and/or programs that use the resources of a distributed computer system, via communication framework 1240. Communication framework 1240 can comprise wired network devices, wireless network devices, mobile devices, wearable devices, radio access network devices, gateway devices, femtocell devices, servers, etc.

The system 1200 also comprises one or more local component(s) 1220. The local component(s) 1220 can be hardware and/or software (e.g., threads, processes, computing devices). In some embodiments, local component(s) 1220 can comprise an automatic scaling component and/or programs that communicate/use the remote resources 1210 and 1220, etc., connected to a remotely located distributed computing system via communication framework 1240.

One possible communication between a remote component(s) 1210 and a local component(s) 1220 can be in the form of a data packet adapted to be transmitted between two or more computer processes. Another possible communication between a remote component(s) 1210 and a local component(s) 1220 can be in the form of circuit-switched data adapted to be transmitted between two or more computer processes in radio time slots. The system 1200 comprises a communication framework 1240 that can be employed to facilitate communications between the remote component(s) 1210 and the local component(s) 1220, and can comprise an air interface, e.g., Uu interface of a UMTS network, via a long-term evolution (LTE) network, etc. Remote component(s) 1210 can be operably connected to one or more remote data store(s) 1250, such as a hard drive, solid state drive, SIM card, device memory, etc., that can be employed to store information on the remote component(s) 1210 side of communication framework 1240. Similarly, local component(s) 1220 can be operably connected to one or more local data store(s) 1230, that can be employed to store information on the local component(s) 1220 side of communication framework 1240.

Figure 13:
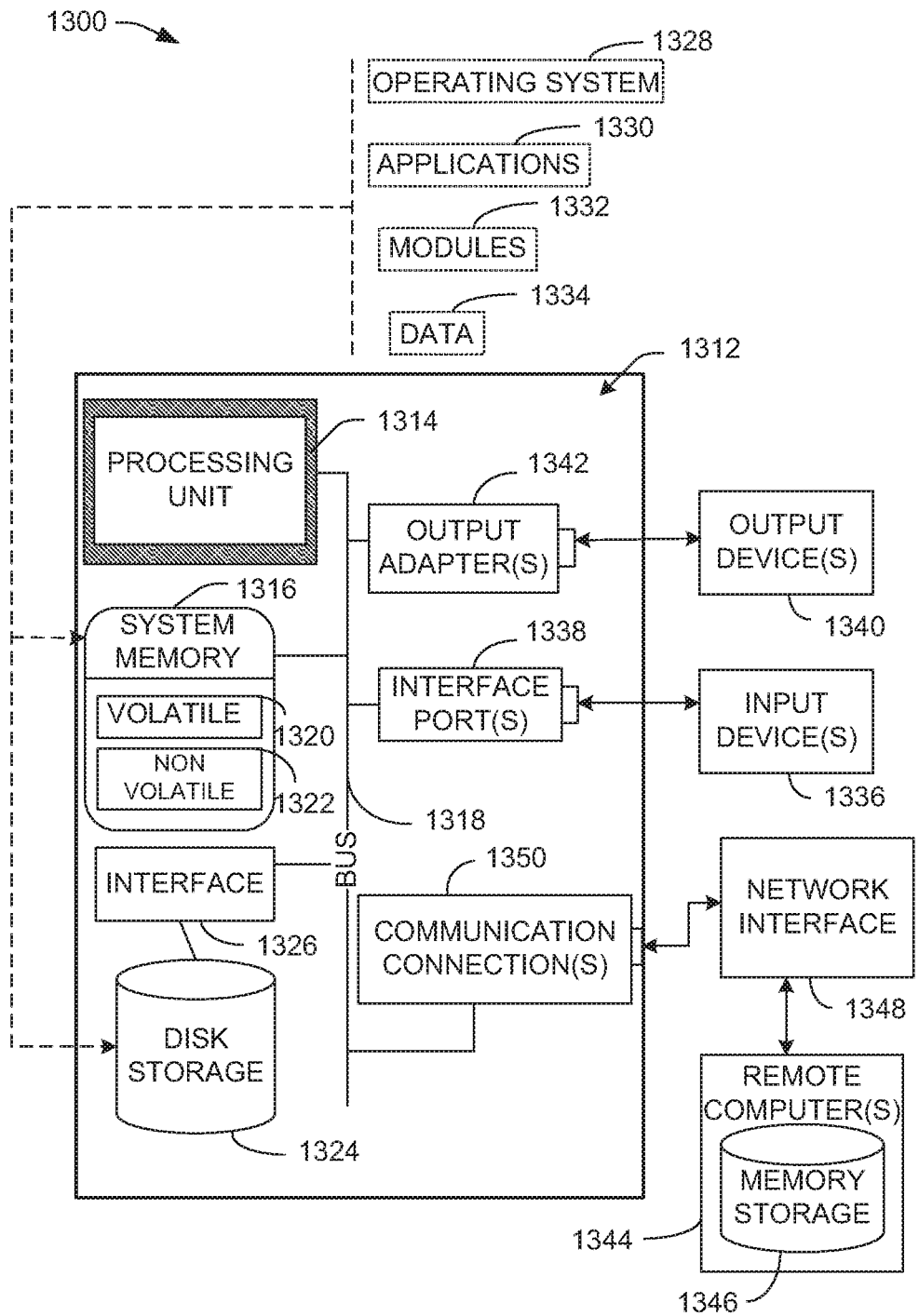
FIG. 13 illustrates an example block diagram of a computing system operable to execute the disclosed systems and methods in accordance with various aspects and implementations of the subject disclosure.

In order to provide a context for the various aspects of the disclosed subject matter, FIG. 13, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1320 (see below), nonvolatile memory 1322 (see below), disk storage 1324 (see below), and memory storage 1346 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, SynchLink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 13 illustrates a block diagram of a computing system 1300 operable to execute the disclosed systems and methods in accordance with one or more embodiments/implementations described herein. Computer 1312, can comprise a processing unit 1314, a system memory 1316, and a system bus 1318. System bus 1318 couples system components comprising, but not limited to, system memory 1316 to processing unit 1314. Processing unit 1314 can be any of various available processors. Dual microprocessors and other multiprocessor architectures also can be employed as processing unit 1314.

System bus 1318 can be any of several types of bus structure(s) comprising a memory bus or a memory controller, a peripheral bus or an external bus, and/or a local bus using any variety of available bus architectures comprising, but not limited to, industrial standard architecture, microchannel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1594), and small computer systems interface.

System memory 1316 can comprise volatile memory 1320 and nonvolatile memory 1322. A basic input/output system, containing routines to transfer information between elements within computer 1312, such as during start-up, can be stored in nonvolatile memory 1322. By way of illustration, and not limitation, nonvolatile memory 1322 can comprise read only memory, programmable read only memory, electrically programmable read only memory, electrically erasable read only memory, or flash memory. Volatile memory 1320 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, SynchLink dynamic read only memory, Rambus direct read only memory, direct Rambus dynamic read only memory, and Rambus dynamic read only memory.

Computer 1312 can also comprise removable/non-removable, volatile/non-volatile computer storage media. FIG. 13 illustrates, for example, disk storage 1324. Disk storage 1324 comprises, but is not limited to, devices like a magnetic disk drive, floppy disk drive, tape drive, flash memory card, or memory stick. In addition, disk storage 1324 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1324 to system bus 1318, a removable or non-removable interface is typically used, such as interface 1326.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. As such, for example, a computer-readable medium can comprise executable instructions stored thereon that, in response to execution, can cause a system comprising a processor to perform operations, comprising determining a mapped cluster schema, altering the mapped cluster schema until a rule is satisfied, allocating storage space according to the mapped cluster schema, and enabling a data operation corresponding to the allocated storage space, as disclosed herein.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 13 describes software that acts as an intermediary between users and computer resources described in suitable operating environment 1300. Such software comprises an operating system 1328. Operating system 1328, which can be stored on disk storage 1324, acts to control and allocate resources of computer system 1312. System applications 1330 take advantage of the management of resources by operating system 1328 through program modules 1332 and program data 1334 stored either in system memory 1316 or on disk storage 1324. It is to be noted that the disclosed subject matter can be implemented with various operating systems or combinations of operating systems.

A user can enter commands or information into computer 1312 through input device(s) 1336. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1312. Input devices 1336 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1314 through system bus 1318 by way of interface port(s) 1338. Interface port(s) 1338 comprise, for example, a serial port, a parallel port, a game port, a universal serial bus, an infrared port, a Bluetooth port, an IP port, or a logical port associated with a wireless service, etc. Output device(s) 1340 use some of the same type of ports as input device(s) 1336.

Thus, for example, a universal serial busport can be used to provide input to computer 1312 and to output information from computer 1312 to an output device 1340. Output adapter 1342 is provided to illustrate that there are some output devices 1340 like monitors, speakers, and printers, among other output devices 1340, which use special adapters. Output adapters 1342 comprise, by way of illustration and not limitation, video and sound cards that provide means of connection between output device 1340 and system bus 1318. It should be noted that other devices and/or systems of devices provide both input and output capabilities such as remote computer(s) 1344.

Computer 1312 can operate in a networked environment using logical connections to one or more remote computers, such as remote computer(s) 1344. Remote computer(s) 1344 can be a personal computer, a server, a router, a network PC, cloud storage, a cloud service, code executing in a cloud computing environment, a workstation, a microprocessor-based appliance, a peer device, or other common network node and the like, and typically comprises many or all of the elements described relative to computer 1312. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1346 is illustrated with remote computer(s) 1344. Remote computer(s) 1344 is logically connected to computer 1312 through a network interface 1348 and then physically connected by way of communication connection 1350. Network interface 1348 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1350 refer(s) to hardware/software employed to connect network interface 1348 to bus 1318. While communication connection 1350 is shown for illustrative clarity inside computer 1312, it can also be external to computer 1312. The hardware/software for connection to network interface 1348 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the invention is susceptible to various modifications and alternative constructions, certain illustrated implementations thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the invention is not to be limited to any single implementation, but rather is to be construed in breadth, spirit and scope in accordance with the appended claims.

What is claimed is:

1. A system, comprising:
    a processor; and
    a memory that stores executable instructions that, when executed by the processor, facilitate performance of operations, the operations comprising:
    in response to detection of a failing storage device, performing a proactive recovery operation, the performing the proactive recovery operation comprising:
        in response to determining, by a first process of the system, that the data portion on the failing storage device is not to be processed by a second process of the system, logically moving the data portion to a non-failing storage device; and
        in response to determining, by the first process, that the data portion on the failing storage device is to be processed by the second process based on the data portion being in a backlog of the second process, delegating recovery of the data portion to the second process.

2. The system of claim 1, wherein the logically moving the data portion to the non-failing storage device comprises:
    determining that the data portion is protected by mirroring a copy of the data portion on a second storage device;
    reading the copy of the data portion from the second storage device; and
    storing the copy of the data portion that was read from the second storage device to the non-failing storage device.

3. The system of claim 1, wherein the logically moving the data portion to the non-failing storage device comprises:
    determining that the data portion is protected using erasure coding;
    reading a fragment of the data portion;
    validating the fragment;
    in response to the fragment being consistent based on the validating, storing the fragment to a non-failing storage device; and
    in response to the fragment not being consistent based on the validating,
        recovering the fragment into a recovered fragment; and
        storing the recovered fragment on the non-failing storage device.

4. The system of claim 3, wherein the recovering the fragment into the recovered fragment and the storing the recovered fragment on the non-failing storage device comprises:
    enqueuing a recovery task for the data portion.

5. The system of claim 1, wherein the data portion on the failing storage device is to be processed by the second process, and wherein the operations further comprise:
    tracking the data portion as a tracked data portion having recovery delegated to the second process;
    determining whether the tracked data portion has been processed by the second process within a time duration;

in response to determining that the tracked data portion has been processed by the second process within the time duration, denoting the tracked data portion as recovered; and
in response to determining that the tracked data portion has not been processed by the second process within the time duration, logically moving the data portion to the non-failing storage device.

6. The system of claim 1, wherein the operations further comprise:
setting a state of the failing storage device to a value that indicates that the storage device is failing.

7. The system of claim 1, wherein the operations further comprise:
in response to determining that the proactive recovery operation is complete, setting a state of the failing storage device to a value that indicates that the storage device is dead.

8. A method, comprising:
running, by a system comprising a processor, a proactive recovery process that logically moves data portions from a failing storage device to one or more non-failing storage devices, comprising:
selecting a selected data portion on a failing storage device;
determining whether the selected data portion is to be directly recovered by the proactive recovery process;
in response to determining that the selected data portion is to be directly recovered by the proactive recovery process, determining whether the selected data portion is protected with a stored copy of the selected data portion that is mirrored on a second storage device; and
in response to determining that the selected data portion is protected with the stored copy of the selected data portion that is mirrored on a second storage device, copying the stored copy of the selected data portion from the second storage device and to a non-failing storage device of the one or more non-failing storage devices.

9. The method of claim 8, wherein the determining whether the selected data portion is to be directly recovered by the proactive recovery process comprises:
in response to establishing that the selected data portion is not to be directly recovered by the proactive recovery process, delegating proactive recovery of the data portion to a second process.

10. The method of claim 9, wherein the establishing that the selected data portion is not to be directly recovered by the proactive recovery process comprises:
determining that the selected data portion is to be accessed by the second process.

11. The method of claim 9, further comprising:
tracking the selected data portion in response to the establishing that the selected data portion is not to be directly recovered by the proactive recovery process.

12. The method of claim 11, further comprising:
determining that the selected data portion has not been recovered by the system process within a time duration; and,
in response to the determining that the selected data portion has not been recovered by the second process within the time duration, logically moving the data portion to the non-failing storage device.

13. The method of claim 8, wherein the determining whether the selected data portion is protected with the stored copy of the selected data portion that is mirrored on a second storage device comprises:
in response to determining that the selected data portion is protected by erasure coding, recovering the selected data portion to the non-failing storage device, comprising:
reading a fragment of the selected data portion;
validating the fragment; and
in response to the fragment being consistent based on the validating, storing the fragment to the non-failing storage device.

14. The method of claim 13, wherein the recovering the selected data portion to the non-failing storage device further comprises:
in response to the fragment not being consistent based on the validating, taking action to recover the selected data portion, comprising enqueuing a recovery task corresponding to the selected data portion.

15. The method of claim 8, further comprising:
detecting the failing storage device; and
setting a state of the failing storage device to a value that indicates that the storage device is failing.

16. The method of claim 8, further comprising:
in response to detecting that the selected data portion is the last data portion to be recovered from the failing storage device, setting a state of the failing storage device to a value that indicates that the storage device is dead.

17. A non-transitory machine-readable medium, comprising executable instructions that, when executed by a processor, facilitate performance of operations, the operations comprising:
obtaining, using a system process configured for data portion processing, a data portion having data portion components stored to a failing storage device;
determining whether the data portion is protected by mirroring or protected using erasure coding;
in response to determining that the data portion is protected by mirroring, wherein mirroring comprises storing a copy of the data portion on a second storage device, reading the copy of the data portion from the second storage device and processing the copy of the data portion via the system process;
in response to determining that the data portion is protected using erasure coding, reading a fragment of the data portion, and validating the fragment;
in response to the fragment being consistent based on the validating, processing the data portion via the system process; and
in response to the fragment not being consistent based on the validating, recovering the fragment into a recovered fragment and processing the recovered fragment via the system process.

18. The non-transitory machine-readable medium of claim 17, wherein the recovering the fragment comprises:
enqueuing a recovery task for the data portion.

19. The non-transitory machine-readable medium of claim 17, wherein the operations further comprise:
in response to determining that the data portion is protected by mirroring, copying the copy of the data portion as read from the second storage device to a non-failing storage device.

20. The non-transitory machine-readable medium of claim 17, wherein the operations further comprise:

in response to determining that the data portion is protected using erasure coding, and in response to the fragment being consistent based on the validating, storing the data portion copy to a non-failing storage device.

* * * * *